(12) United States Patent
Chen et al.

(10) Patent No.: US 11,114,310 B1
(45) Date of Patent: Sep. 7, 2021

(54) EMBEDDED PACKAGING METHOD CAPABLE OF REALIZING HEAT DISSIPATION

(71) Applicant: Zhuhai ACCESS Semiconductor Co., Ltd, Zhuhai (CN)

(72) Inventors: Xianming Chen, Zhuhai (CN); Wenshi Wang, Zhuhai (CN); Weiyuan Yang, Zhuhai (CN); Minxiong Li, Zhuhai (CN); Benxia Huang, Zhuhai (CN); Lei Feng, Zhuhai (CN)

(73) Assignee: ZHUHAI ACCESS SEMICONDUCTOR CO., LTD, Zhuhai (CN)

( * ) Notice: Subject to any disclaimer, the term of this patent is extended or adjusted under 35 U.S.C. 154(b) by 0 days.

(21) Appl. No.: 17/026,788

(22) Filed: Sep. 21, 2020

(30) Foreign Application Priority Data

Jun. 22, 2020 (CN) .......................... 202010570659.6

(51) Int. Cl.
*H01L 21/50* (2006.01)
*H01L 23/532* (2006.01)
*H01L 23/538* (2006.01)
*H01L 23/36* (2006.01)

(52) U.S. Cl.
CPC .............. *H01L 21/50* (2013.01); *H01L 23/36* (2013.01); *H01L 23/5384* (2013.01); *H01L 23/5386* (2013.01); *H01L 23/53228* (2013.01)

(58) Field of Classification Search
CPC ..... H01L 21/50; H01L 23/5384; H01L 23/36; H01L 23/5386; H01L 23/53228
See application file for complete search history.

(56) References Cited

U.S. PATENT DOCUMENTS

2020/0083173 A1\* 3/2020 Weidinger .......... H01L 21/4853

\* cited by examiner

*Primary Examiner* — Quoc D Hoang
(74) *Attorney, Agent, or Firm* — The Dobrusin Law Firm, P.C.

(57) ABSTRACT

An embedded packaging method capable of realizing heat dissipation, includes: providing a frame having at least one through hole; attaching a tape on the first surface and placing a device in the through hole; completely filling the through hole with photosensitive insulating material, and completely curing the photosensitive insulating material in a lower portion of the through hole while not completely curing the photosensitive insulating material in an upper portion of the through hole and covered on the second surface; electroplating on the first surface to form a first metal layer, and electroplating on the upper surface and a side surface of the device, an upper surface of the photosensitive insulating material and an upper end face of each of the first copper pillars to form a second metal layer; and etching to obtain a first circuit layer and a second circuit layer, respectively.

7 Claims, 5 Drawing Sheets

EMBEDDED PACKAGING METHOD CAPABLE OF REALIZING HEAT DISSIPATION

CROSS-REFERENCE TO RELATED APPLICATIONS

This application is based on and claims the benefit of priority from Chinese Patent Application No. 2020105706596, filed on 22 Jun. 2020, the contents of which are incorporated by reference herein in its entirety.

TECHNICAL FIELD

The disclosure relates to the field of semiconductor packaging and in particular to a packaging method.

BACKGROUND

With the rapid development of the electronics industry, existing electronic products have become increasingly lighter and thinner, and their integration and functionality are also increasing. Therefore, circuit boards used to carry electronic devices such as resistors, capacitors or chips are inevitably required to be lighter and thinner. Thus, the circuit board packaging technology is derived. Among others, the embedded packaging technology has been widely used in power management products such as filters and power amplifiers, and is becoming more and more popular. The embedded packaging technology is a high-density packaging technology that embeds electronic devices into an embedded packaging substrate. It can shorten the circuit length, improve the electrical characteristics, and reduce solder joints on the circuit board surface, thereby improving the reliability of the packaging and reducing the cost. However, with the increasing integration of electronic devices, heat dissipation has become one of the primary considerations in the design of embedded packaging.

The embedded packaging technology in the related art adopts a single-sided heat dissipation packaging method. That is, through holes are formed in the back of the embedded packaging substrate by laser drilling or plasma etching, and then the through holes are metalized to form a thermally conductive copper pillar. Alternatively, a large-area copper sheet is directly formed on the back of the embedded package substrate. This single-sided heat dissipation packaging has a limited heat dissipation area, and the use of laser drilling or plasma etching is likely to cause damage to the electronic devices and results in high production cost and long production period.

SUMMARY

The disclosure is intended to solve at least one of problems existing in the related art. For this purpose, the disclosure provides an embedded packaging method capable of realizing heat dissipation, which can increase the heat dissipation area of the device, reduce the production cost and shorten the production period.

The embedded packaging method capable of realizing heat dissipation according to an embodiment of the disclosure includes following steps of: S1: providing a frame having at least one through hole, the frame being vertically provided with a certain number of first copper pillars, and a lower surface of the frame being a first surface; S2: attaching a tape on the first surface so that an adhesive surface of the tape is attached to the first surface, and placing a device in the through hole with a contact of the device being attached to the tape; S3: curing photosensitive insulating material in a partial space of the through hole to expose a upper surface of the device and at least part of a side surface of the device; S4: removing the tape, electroplating on the first surface to form a first metal layer, and electroplating on the upper surface and side surface of the device, an upper surface of the photosensitive insulating material and an upper end face of each of the first copper pillars to form a second metal layer, the second metal layer covering the upper end face of each of the first copper pillars and the upper surface and at least part of the side surface of the device; and S5: etching the first metal layer and the second metal layer to obtain a first circuit layer and a second circuit layer, respectively, the contact of the device being electrically connected to the first circuit layer, and an upper end and a lower end of each of the first copper pillars being electrically connected to the second circuit layer and the first circuit layer, respectively.

The disclosure has the following beneficial effects. In the disclosure, the packaging process is simplified by adhering the device placed in the through hole through the tape; the second metal layer wraps the upper surface and at least part of the side surface of the device, and therefore, compared with the conventional single-sided heat dissipation packaging method, the disclosure increases the heat dissipation area of the device so that the device can realize multi-directional heat dissipation, and thus the heat dissipation efficiency is improved; compared with laser drilling or plasma etching, etc., filling part of the through hole with photosensitive insulating material can reduce the production cost and shorten the production period.

According to some embodiments of the disclosure, the step S3 specifically includes: S3.1: first, completely filling the through hole with photosensitive insulating material; 3.2: exposing the first surface and a second surface opposite to the first surface with different energies, completely curing the photosensitive insulating material in a lower portion of the through hole while not completely curing the photosensitive insulating material in an upper portion of the through hole; and S3.3: exposing the upper surface of the device and at least part of the side surface of the device by developing.

According to some embodiments of the disclosure, the step S3 specifically includes: S3.1: completely filling the through hole with photosensitive insulating material and covering a second surface opposite to the first surface; S3.2: exposing the first surface and the second surface with different energies, completely curing the photosensitive insulating material in a lower portion of the through hole while not completely curing the photosensitive insulating material in an upper portion of the through hole and covered on the second surface; S3.3: exposing the upper surface of the device and at least part of the side surface of the device by developing, and forming holes in regions corresponding to the first copper pillars of the photosensitive insulating material covered on the second surface.

According to some embodiments of the disclosure, the step S4 specifically includes: S4.1: removing the tape first, forming a first seed layer on the first surface by electroplating or sputtering, and forming a second seed layer on the upper surface of the photosensitive insulating material, the upper surface and side surface of the device and an inner surface of each of the holes by electroplating or sputtering; and S4.2: electroplating on the first seed layer and the second seed layer to form a first metal layer and a second metal layer, respectively, the second metal layer wrapping the upper surface and at least part of the side surface of the device and completely filling the hole.

According to some embodiments of the disclosure, the step S4 specifically includes: S4.1: removing the tape first, forming a first seed layer on the first surface by electroplating or sputtering, and forming a second seed layer on the upper surface of the photosensitive insulating material, the upper surface and side surface of the device and the upper end of the first copper pillars by electroplating or sputtering; and S4.2: electroplating on the first seed layer and the second seed layer to form a first metal layer and a second metal layer, respectively, the second metal layer wrapping the upper surface and at least part of the side surface of the device.

According to some embodiments of the disclosure, the step S5 specifically includes: S5.1: attaching a first photosensitive film to the first metal layer and the second metal layer; S5.2: obtaining a circuit pattern by photolithography and development, etching the first metal layer and the second metal layer to obtain a first circuit layer and a second circuit layer, respectively, the contact of the device being electrically connected to the first circuit layer, the upper and lower ends of the first copper pillar being electrically connected to the second circuit layer and the first circuit layer, respectively; and S5.3: removing the first photosensitive film.

According to some embodiments of the disclosure, the method further includes: S6: forming a certain number of second copper pillars respectively on the first circuit layer and the second circuit layer, filling and press-fitting a dielectric material to form a first sealing layer and a second sealing layer on the first circuit layer and the second circuit layer, respectively, and thinning the dielectric material by etching to expose the second copper pillars; and S7: forming a third circuit layer and a fourth circuit layer on the first sealing layer and the second sealing layer, respectively, the second copper pillars electrically connecting the first circuit layer with the third circuit layer and electrically connecting the second circuit layer with the fourth circuit layer, respectively.

According to some embodiments of the disclosure, the step S6 specifically includes: S6.1: attaching a second photosensitive film to each of the first circuit layer and the second circuit layer; S6.2: forming, by photolithography and development, a certain number of copper pillar through holes in the second photosensitive film on the first circuit layer and the second circuit layer, respectively; S6.3: removing the second photosensitive film after forming the certain number of second copper pillars in the copper pillar through holes by electroplating; and S6.4: filling and press-fitting a dielectric material to form a first sealing layer and a second sealing layer on the first circuit layer and the second circuit layer, respectively, and thinning the dielectric material by etching to expose the second copper pillars.

According to some embodiments of the disclosure, the method further includes: S8: coating or press-fitting a solder resist on an outermost circuit layer, and forming a solder resist window on the solder resist.

According to some embodiments of the disclosure, the frame is made of resin.

BRIEF DESCRIPTION OF THE DRAWINGS

The above and/or additional aspects and advantages of the disclosure will become apparent and be readily understood from the following description of embodiments with reference to the accompanying drawings:

FIG. 7 is a longitudinal sectional view obtained by the step S8 according to another embodiment of the disclosure, in which:

1: frame; 11: first surface; 111: first seed layer; 12: second surface; 121: second seed layer; 13: through hole; 14: first copper pillar; 15: first metal layer; 151: first circuit layer; 16: second metal layer; 161: second circuit layer; 17: first sealing layer; 171: third circuit layer; 18: second sealing layer; 181: fourth circuit layer; 19: solder resist window; 2: tape; 3: device; 4: hole; 5: first photosensitive film; and 6: second copper pillar.

DETAILED DESCRIPTION

Embodiments of the disclosure will be described below in detail. Examples of the embodiments to be described are shown in the drawings. Throughout the drawings, same or similar reference numerals represent same or similar elements or elements having a same or similar function. The embodiments to be described with reference to the accompanying drawings are exemplary, and are merely intended to explain the disclosure rather than limiting the disclosure.

In the description of the disclosure, it should be understood that orientations or locations indicated by terms "upper" and "low" are the orientations or locations illustrated on the basis of the accompanying drawings, merely used for conveniently describing the disclosure and simplifying the description and not intended to indicate or imply that the stated device or element must have the specific orientations or must be constructed and operated in the specific orientations, thus shall not be interpreted as any limitations to the disclosure.

In the description of the disclosure, the term "a certain number of" means "one or more"; and the term "a plurality of" means "two or more". Terms "first", "second", "third" and "fourth" are used only for the purpose of distinguishing the technical features, and should not be understood as indicating or implying relative importance or implicitly indicating the number of the stated technical features or implicitly indicating the order of the stated technical features.

In the description of the disclosure, unless otherwise clearly defined, terms such as "arrange", "connect", "attach" should be understood in a broad sense, and those skilled in the art can properly determine the specific meaning of the above terms in the disclosure in conjunction with the specific content of the technical solution.

Figure 1:
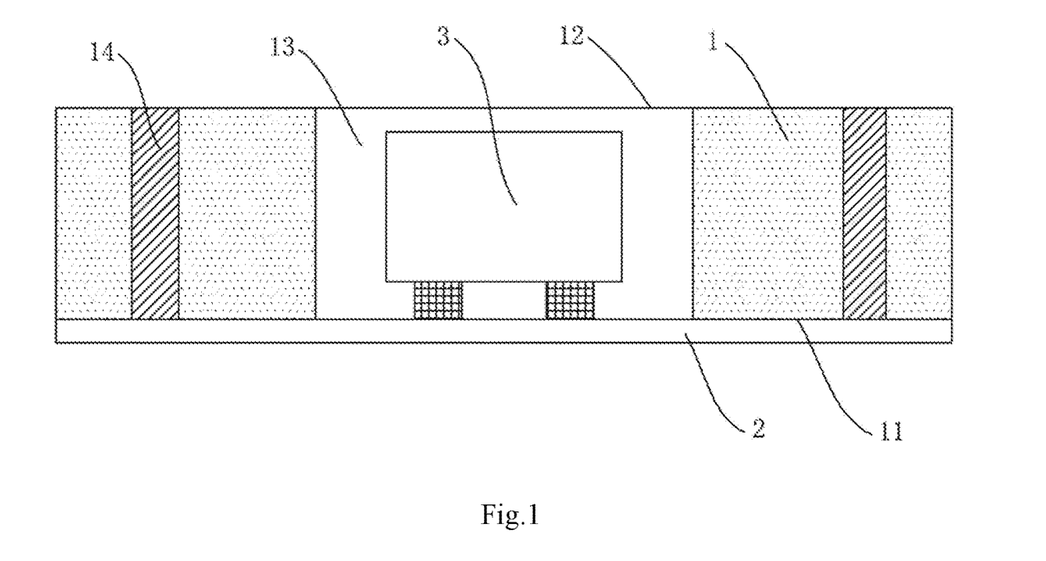
FIG. 1 is a longitudinal sectional view obtained by the step S2 according to embodiments of the disclosure.
Figure 2:
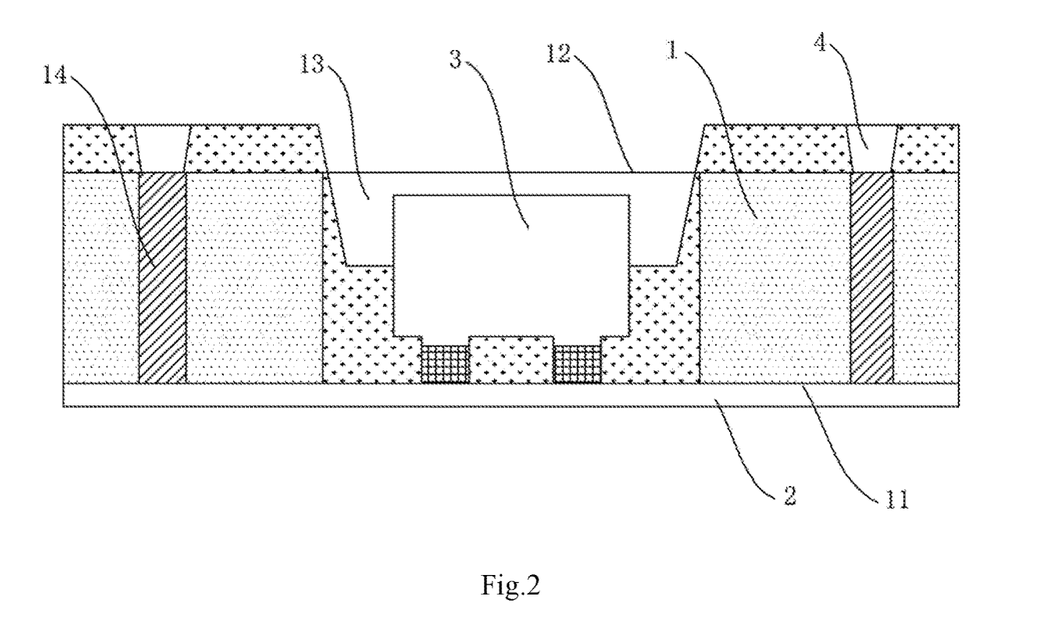
FIG. 2 is a longitudinal sectional view obtained by the step S3 according to embodiments of the disclosure.
Figure 3:
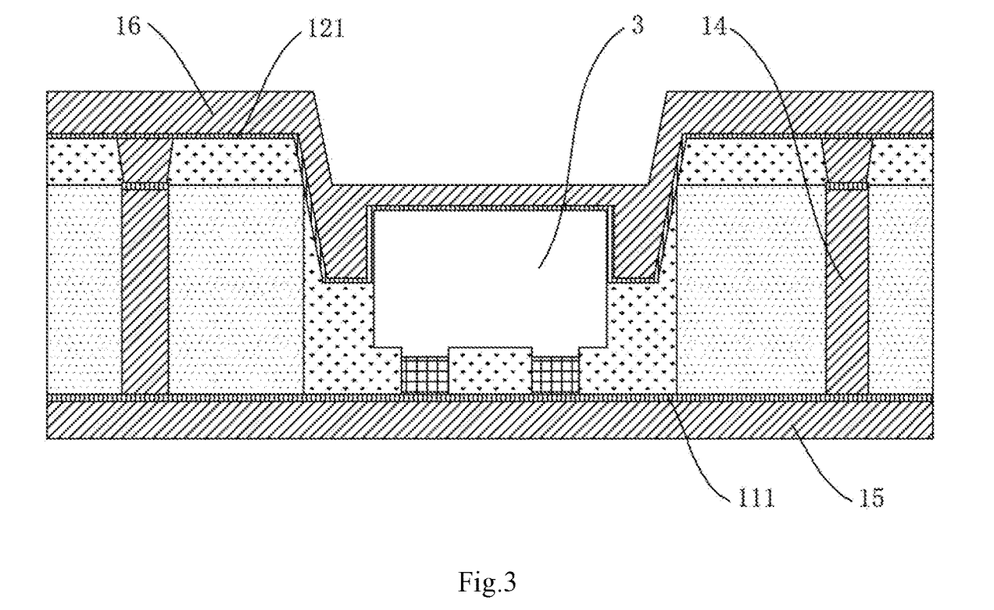
FIG. 3 is a longitudinal sectional view obtained by the step S4 according to embodiments of the disclosure.
Figure 4:
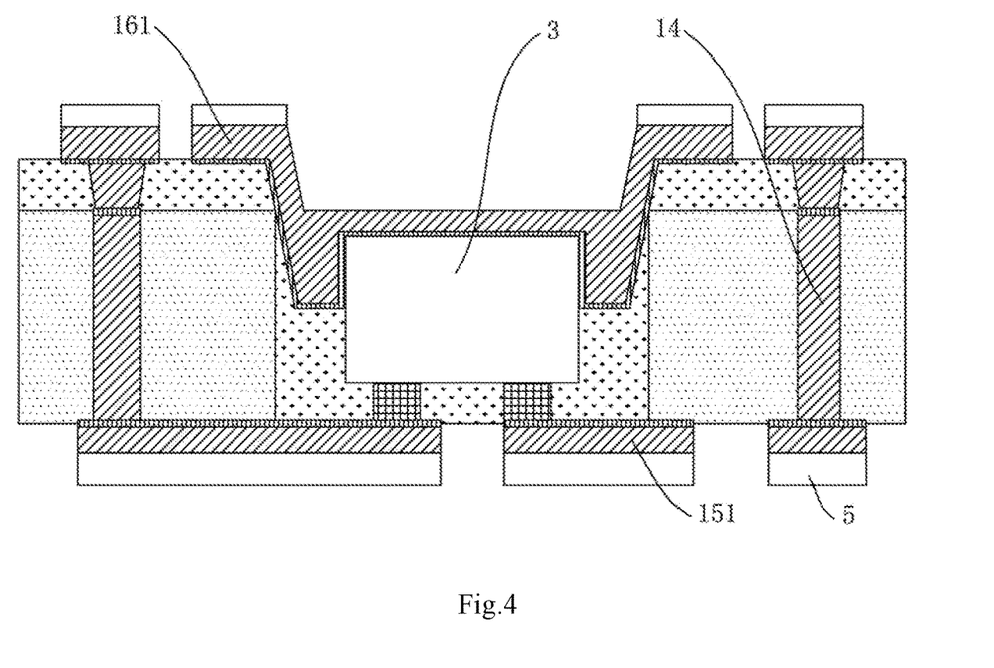
FIG. 4 is a longitudinal sectional view obtained by the step S5 according to embodiments of the disclosure.

With reference to FIGS. 1-4, an embedded packaging method capable of realizing heat dissipation is provided according to the disclosure, including following steps of:

S1: providing a frame 1 having at least one through hole 13, the frame 1 being vertically provided with a plurality of first copper pillars 14, a lower surface of the frame 1 being a first surface 11;

S2: attaching a tape 2 on the first surface 11 so that an adhesive surface of the tape 2 is attached to the first surface 11, and placing a device 3 in the through hole 13 with a contact of the device 3 being attached to the tape 2;

S3: curing photosensitive insulating material in a partial space of the through hole 13 to expose an upper surface of the device 3 and at least part of a side surface of the device 3 are exposed;

S4: removing the tape 2, electroplating on the first surface 11 to form a first metal layer 15, and electroplating on the upper surface and side surface of the device 3, an upper surface of the photosensitive insulating material and an upper end face of each of the first copper pillars 14 to form a second metal layer 16, the second metal layer 16 covering the upper end face of each of the first copper pillars 14 and the upper surface and at least part of the side surface of the device 3; and S5: etching the first metal layer 15 and the second metal layer 16 to obtain a first circuit layer 151 and a second circuit layer 161, respectively, the contact of the device 3 being electrically connected to the first circuit layer 151, and an upper end and a lower end of each of the first copper pillars 14 being electrically connected to the second circuit layer 161 and the first circuit layer 151, respectively.

It may be understood that, in the disclosure, the packaging process is simplified by adhering the device 3 placed in the through hole 13 through the tape 2; the second metal layer 16 wraps the upper surface and at least part of the side surface of the device 3, and therefore, compared with the conventional single-sided heat dissipation packaging method, the disclosure increases the heat dissipation area of the device 3 so that the device 3 can realize multi-directional heat dissipation, and thus the heat dissipation efficiency is improved; compared with laser drilling or plasma etching, etc., filling part of the through hole 13 with photosensitive insulating material can reduce the production cost and shorten the production period.

Specifically, the frame 1 is made of resin and the first copper pillars 14 are made of copper.

Specifically, at step S1, there may be one or more through holes 13 and one or more first copper pillars 14. A plurality of through holes 13 are distributed in the frame 1, and a certain number of first copper pillars 14 are distributed on the frame 1.

Specifically, at step S2, the device 3 may be a passive device, for example, a resistor, a capacitor, or an inductor; or, may be an active device, for example, a chip. The device 3 may be an individual device 3, or a combination of a plurality of devices 3 stacked back to back. The tape 2 may be a thermal release tape or a UV tape. When the thermal release tape is used, the thermal release tape can be heated to a certain temperature before removing the tape 2.

Specifically, at step S3, the photosensitive insulating material is a stable solid organic polymer product formed by crosslinked polymerization of low-molecular unsaturated organic oligomer, accompanied by a specific catalyst, in the presence of light (ultraviolet or visible light) or high-energy rays (mainly electron beams). This product has good dielectric properties (electrical insulation properties), with a dielectric constant of 2.5 to 3.4, a dielectric loss of 0.001 to 0.01, a dielectric strength of 100 KV to 400 KV, and a surface resistance and a volume resistance of $10e17\ \Omega\cdot m$, for example, PI (polyimide), PPO (polyphenylene oxide), etc.

Specifically, at step S4, the first metal layer 15 and the second metal layer 16 are made of metal material, including but not limited to copper. In addition, the second metal layer 16 may cover the whole side surface of the device 3 or only a part of the side surface of the device 3. When the second metal layer 16 covers the whole side surface of the device 3, there is a large contact area between the device 3 and the second metal layer 16, which is more conducive to the heat dissipation of the device 3. When the second metal layer 16 wraps part of the side surface of the device 3, since a lower portion of the through hole 13 is also wrapped with cured photosensitive insulating material, the thermal stress generated during the operation of the device 3 can be better released, avoiding damage to the device 3.

Figure 5:
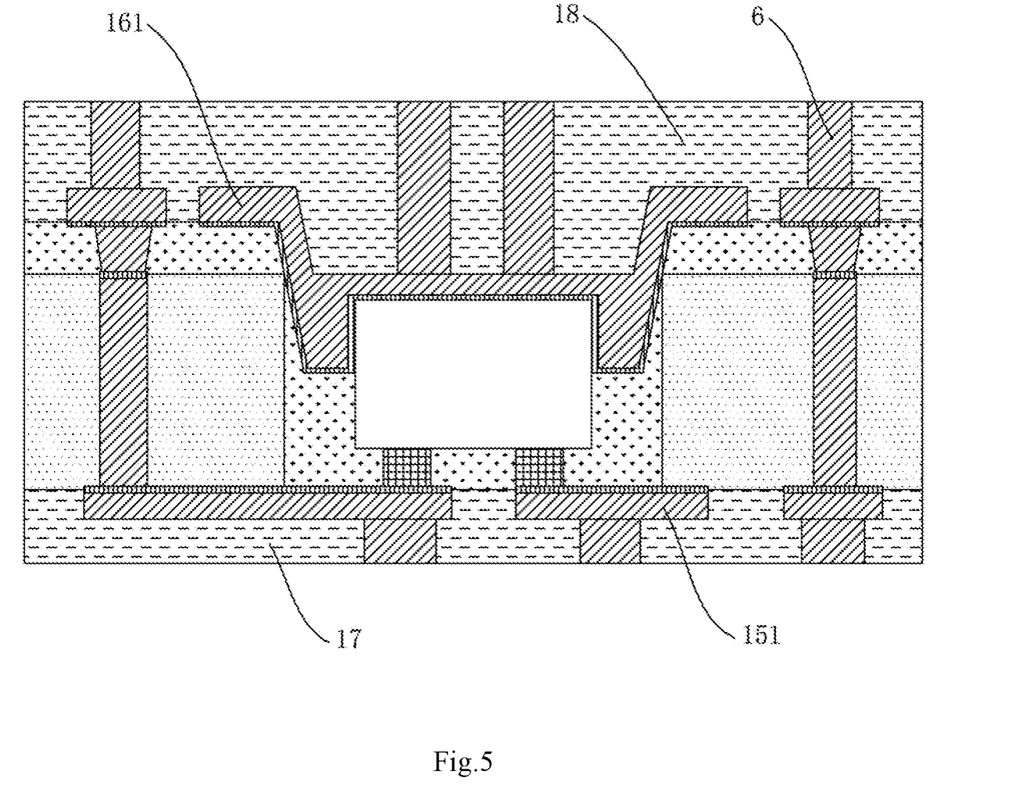
FIG. 5 is a longitudinal sectional view obtained by the step S6 according to one embodiment of the disclosure.
Figure 6:
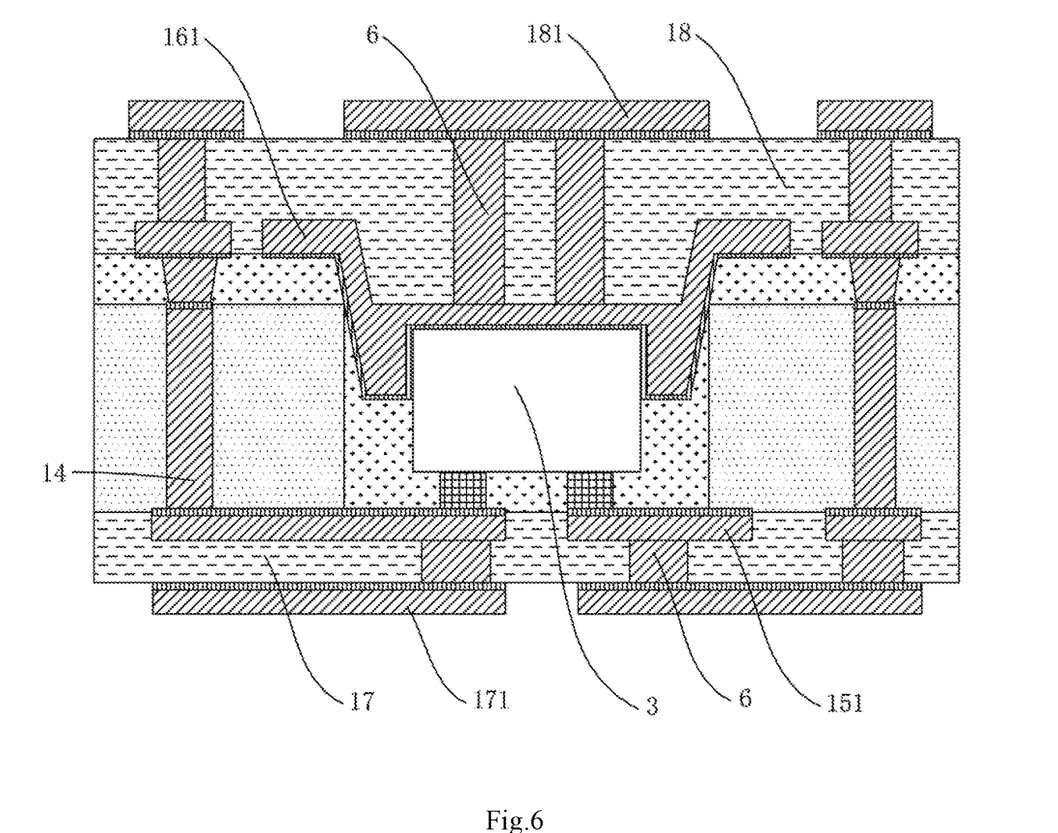
FIG. 6 is a longitudinal sectional view obtained by the step S7 according to one embodiment of the disclosure.

The disclosure further provides an embodiment, specifically including:

S1: providing a frame 1 having at least one through hole 13, the frame 1 being vertically provided with a certain number of first copper pillars 14, and a lower surface of the frame 1 being a first surface 11;

S2: attaching a tape 2 on the first surface 11 so that an adhesive surface of the tape 2 is attached to the first surface 11, and placing a device 3 in the through hole 13 with a contact of the device 3 being attached to the tape 2;

S3.1: first, completely filling the through hole 13 with photosensitive insulating material;

S3.2: exposing the first surface 11 and a second surface 12 opposite to the first surface 11 with different energies, completely curing the photosensitive insulating material in a lower portion of the through hole 13 while not completely curing the photosensitive insulating material in an upper portion of the through hole 13;

S3.3: exposing the upper surface of the device 3 and at least part of the side surface of the device 3 by developing;

S4.1: removing the tape 2 first, forming a first seed layer 111 on the first surface 11 by electroplating or sputtering, and forming a second seed layer 112 on the upper surface of the photosensitive insulating material, the upper surface and side surface of the device 3 and the upper end of each of the first copper pillars 14 by electroplating or sputtering;

S4.2: electroplating on the first seed layer 111 and the second seed layer 112 to form a first metal layer 15 and a second metal layer 16, respectively, the second metal layer 16 wrapping the upper surface and at least part of the side surface of the device 3;

S5.1: attaching a first photosensitive film 5 to the first metal layer 15 and the second metal layer 16;

S5.2: obtaining a circuit pattern by photolithography and development, etching the first metal layer 15 and the second metal layer 16 to obtain a first circuit layer 151 and a second circuit layer 161, respectively, the contact of the device 3 being electrically connected to the first circuit layer 151, and the upper and lower ends of the first copper pillar 14 being electrically connected to the second circuit layer 161 and the first circuit layer 151, respectively;

S5.3: removing the first photosensitive film 5;

S6: forming a certain number of second copper pillars 6 respectively on the first circuit layer 151 and the second circuit layer 161, filling and press-fitting a dielectric material to form a first sealing layer 17 and a second sealing layer 18 on the first circuit layer 151 and the second circuit layer 161, respectively, and thinning the dielectric material by etching to expose the second copper pillars 6; and S7: forming a third circuit layer 171 and a fourth circuit layer 181 on the first sealing layer 17 and the second sealing layer 18, respectively, the second copper pillars 6 electrically connecting the first circuit layer 151 with the third circuit layer 171 and electrically connecting the second circuit layer 161 with the fourth circuit layer 181, respectively.

Specifically, at step S3.2, first, the second surface 12 may be exposed, and then the first surface 11 may be subjected to a heavy dose of secondary exposure. For example, an exposure energy of 300 mj/cm² at a wavelength of 365 nm may be used to expose the second surface 12, and then an exposure energy of 600 mj/cm² at a wavelength of 365 nm may be used to expose the first surface 11, such that the photosensitive insulating material in the lower portion of the through hole 13 is completely cured while the photosensitive insulating material in the upper portion of the through hole 13 is not completely cured.

Specifically, at step S3.3, after the development operation, the material at corresponding position of the upper portion of the through hole 13 is removed to cause the through hole to become hollow, so that the upper surface of the device 3 and at least part of the side surface of the device 3 are exposed.

Specifically, at step S4.1, the first seed layer 111 and the second seed layer 121 may be metal, including but not limited to titanium, copper, titanium-tungsten alloy, etc. Due to the presence of the first seed layer 111 and the second seed layer 121, the subsequent first metal layer 15 and second metal layer 16 can be better adhered to the corresponding region during electroplating.

Specifically, at step S5.3, the first photosensitive film 5 may be an organic compound whose solubility in the developing solution changes after exposure to ultraviolet rays, including but not limited to photoresist. The first photosensitive film 5 may be removed by a film removal process. For example, the first photosensitive film 5 may be removed by substances such as sodium hydroxide. The film removal process is not limited thereto.

Figure 7:
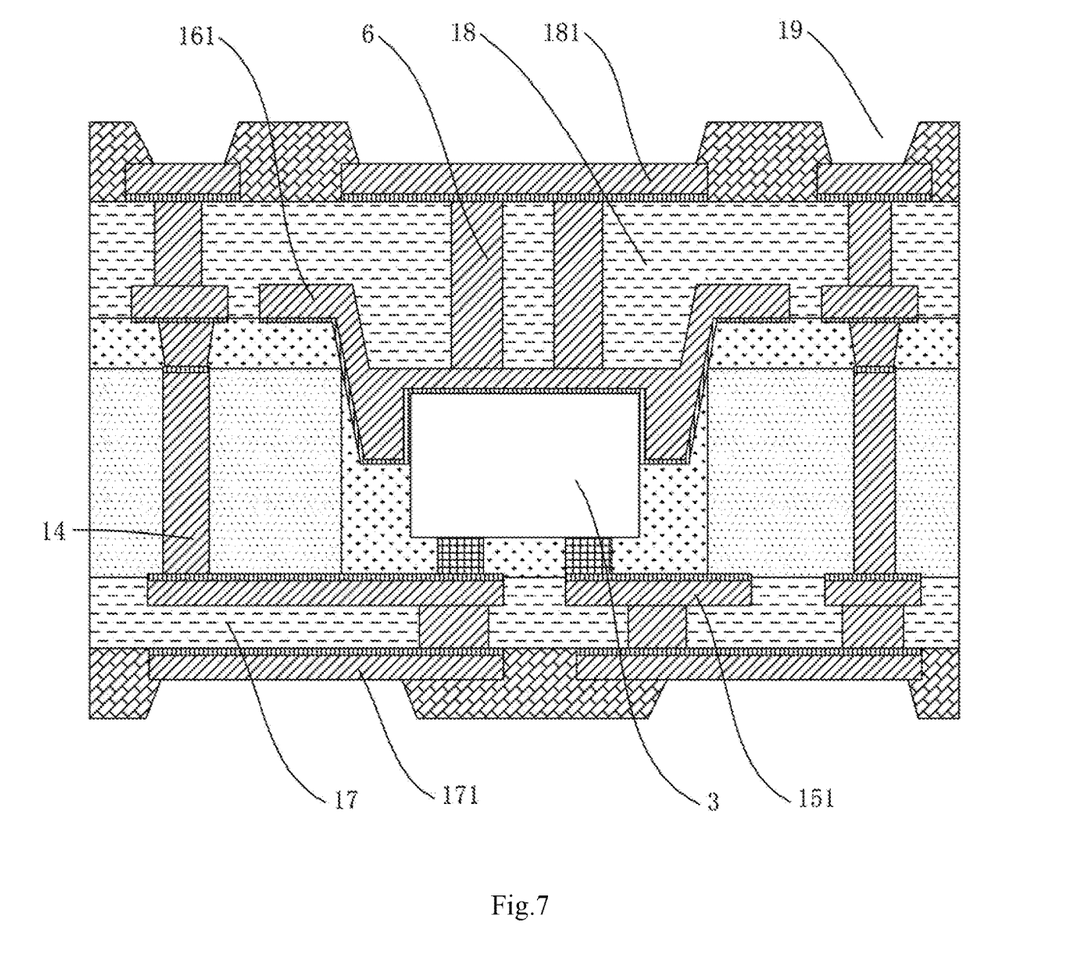

The disclosure further provides another embodiment, specifically including:

S1: providing a frame 1 having at least one through hole 13, the frame 1 being vertically provided with a certain number of first copper pillars 14, and a lower surface of the frame 1 being a first surface 11;

S2: attaching a tape 2 on the first surface 11 so that an adhesive surface of the tape 2 is attached to the first surface 11, and placing a device 3 in the through hole 13 with a contact of the device 3 being attached to the tape 2;

S3.1: completely filling the through hole 13 with photosensitive insulating material and covering a second surface 12 opposite to the first surface 11;

S3.2: exposing the first surface 11 and the second surface 12 with different energies, completely curing the photosensitive insulating material in a lower portion of the through hole 13 while not completely curing the photosensitive insulating material in an upper portion of the through hole 13 and covered on the second surface 12;

S3.3: exposing the upper surface of the device 3 and at least part of the side surface of the device 3 by developing, and forming holes 4 in regions corresponding to the first copper pillars 14 of the photosensitive insulating material covered on the second surface 12;

S4.1: removing the tape 2 first, forming a first seed layer 111 on the first surface 11 by electroplating or sputtering, and forming a second seed layer 112 on the upper surface of the photosensitive insulating material, the upper surface and side surface of the device 3 and an inner surface of each of the holes 4 by electroplating or sputtering;

S4.2: electroplating on the first seed layer 111 and the second seed layer 112 to form a first metal layer 15 and a second metal layer 16, respectively, the second metal layer 16 wrapping the upper surface and at least part of the side surface of the device 3 and completely filling the hole 4;

S5.1: attaching a first photosensitive film 5 to the first metal layer 15 and the second metal layer 16;

S5.2: obtaining a circuit pattern by photolithography and development, etching the first metal layer 15 and the second metal layer 16 to obtain a first circuit layer 151 and a second circuit layer 161, respectively, the contact of the device 3 being electrically connected to the first circuit layer 151, and upper and lower ends of the first copper pillar 14 being electrically connected to the second circuit layer 161 and the first circuit layer 151, respectively;

S5.3: removing the first photosensitive film 5;

S6.1: attaching a second photosensitive film to each of the first circuit layer 151 and the second circuit layer 161;

S6.2: forming, by photolithography and development, a certain number of copper pillar through holes in the second photosensitive film on the first circuit layer 151 and the second circuit layer 161, respectively;

S6.3: removing the second photosensitive film after forming the certain number of second copper pillars 6 in the copper pillar through holes by electroplating;

S6.4: filling and press-fitting a dielectric material to form a first sealing layer 17 and a second sealing layer 18 on the first circuit layer 151 and the second circuit layer 161, respectively, and thinning the dielectric material by etching to expose the second copper pillars 6;

S7: forming a third circuit layer 171 and a fourth circuit layer 181 on the first sealing layer 17 and the second sealing layer 18, respectively, the second copper pillars 6 electrically connecting the first circuit layer 151 with the third circuit layer 171 and electrically connecting the second circuit layer 161 with the fourth circuit layer 181, respectively; and S8: coating or press-fitting a solder resist on an outermost circuit layer, and forming a solder resist window 19 on the solder resist.

The difference between step S3.1 in this embodiment and step S3.1 in the previous embodiment lies in that, while filling the through hole 13 with photosensitive insulating material, the photosensitive insulating material also covers the second surface 12. Covering the second surface 12 with the photosensitive insulating material can protect the second surface 12 in the subsequent exposure and development steps to prevent corrosion of the second surface 12.

Specifically, at step S6.2, the second photosensitive film is a substance that can have polymerization reaction and can be adhered to the surface of the plate after being irradiated by ultraviolet rays, including but not limited to a photosensitive dry film.

Specifically, at step S6.4, the dielectric material may be high-molecular polymer material, for example, resin material.

Specifically, at step S7, the method for forming the third circuit layer 171 and the fourth circuit layer 181 on the first sealing layer 17 and the second sealing layer 18, respectively, can refer to steps S4 and S5. A third seed layer and a fourth seed layer are formed on the first sealing layer 17 and the second sealing layer 18, respectively by electroplating or sputtering; then electroplating is performed on the third seed layer and the fourth seed layer to form a third metal layer and a fourth metal layer, respectively; a first photosensitive film 5 is attached to the third metal layer and the fourth metal layer, and a circuit pattern is obtained by photolithography and development; and finally, the third metal layer and the fourth metal layer are etched to obtain a third circuit layer 171 and a fourth circuit layer 181. The third seed layer and the fourth seed layer may be metal, including but not limited to titanium, copper, titanium-tungsten alloys, etc. The third metal layer and the fourth metal layer are made of metal material, including but not limited to copper. The heat from the device 3 can be transferred to the third circuit layer 171 and the fourth circuit layer 181 through the first circuit layer 151 and the second circuit layer 161 by the second copper pillar 6 respectively, and finally transferred to the outside.

It should be noted that, in the disclosure, more circuit layers can be added by repeating steps S6 and S7, and the number of circuit layers is not limited to the four circuit layers in this embodiment.

Specifically, the step S8 specifically includes: coating or press-fitting a solder resist on the first circuit layer 151 and the second circuit layer 161, or coating or press-fitting a solder resist on the third circuit layer 171 and the fourth circuit layer 181.

The embodiments of the disclosure have been described in detail above with reference to the drawings. However, the disclosure is not limited to the above-mentioned embodiments, and within knowledge of a person of ordinary skill in the art, various changes may be made without departing from the principle of the disclosure.

The invention claimed is:

1. An embedded packaging method capable of realizing heat dissipation, comprising following steps of:
   S1: providing a frame having at least one through hole, the frame being vertically provided with a certain number of first copper pillars, and a lower surface of the frame being a first surface;
   S2: attaching a tape on the first surface so that an adhesive surface of the tape is attached to the first surface, and placing a device in the through hole with a contact of the device being attached to the tape;
   S3: completely filling the through hole with photosensitive insulating material and covering a second surface opposite to the first surface, exposing the first surface and the second surface with different energies, completely curing the photosensitive insulating material in a lower portion of the through hole while not completely curing the photosensitive insulating material in an upper portion of the through hole and covered on the second surface, exposing an upper surface of the device and at least part of a side surface of the device by developing, and forming holes in regions, corresponding to the first copper pillars, of the photosensitive insulating material covered on the second surface;
   S4: removing the tape, electroplating on the first surface to form a first metal layer, and electroplating on the upper surface and side surface of the device, an upper surface of the photosensitive insulating material and an upper end face of each of the first copper pillars to form a second metal layer, the second metal layer covering the upper end face of each of the first copper pillars and the upper surface and at least part of the side surface of the device; and
   S5: etching the first metal layer and the second metal layer to obtain a first circuit layer and a second circuit layer, respectively, the contact of the device being electrically connected to the first circuit layer, and an upper end and a lower end of each of the first copper pillars being electrically connected to the second circuit layer and the first circuit layer, respectively.

2. The embedded packaging method capable of realizing heat dissipation of claim 1, wherein the step S4 specifically comprises:
   S4.1: removing the tape first, forming a first seed layer on the first surface by electroplating or sputtering, and forming a second seed layer on the upper surface of the photosensitive insulating material, the upper surface and side surface of the device and an inner surface of each of the holes by electroplating or sputtering; and
   S4.2: electroplating on the first seed layer and the second seed layer to form a first metal layer and a second metal layer, respectively, the second metal layer wrapping the upper surface and at least part of the side surface of the device and completely filling the hole.

3. The embedded packaging method capable of realizing heat dissipation of claim 1, wherein the step S5 specifically comprises:
   S5.1: attaching a first photosensitive film to the first metal layer and the second metal layer;
   S5.2: obtaining a circuit pattern by photolithography and development, etching the first metal layer and the second metal layer to obtain a first circuit layer and a second circuit layer, respectively, the contact of the device being electrically connected to the first circuit layer, and the upper and lower ends of the first copper pillar being electrically connected to the second circuit layer and the first circuit layer, respectively; and
   S5.3: removing the first photosensitive film.

4. The embedded packaging method capable of realizing heat dissipation of claim 1, further comprising:
   S6: forming a certain number of second copper pillars on the first circuit layer and the second circuit layer, respectively, filling and press-fitting a dielectric material to form a first sealing layer and a second sealing layer on the first circuit layer and the second circuit layer, respectively, and thinning the dielectric material by etching to expose the second copper pillars; and
   S7: forming a third circuit layer and a fourth circuit layer on the first sealing layer and the second sealing layer, respectively, the second copper pillars electrically connecting the first circuit layer with the third circuit layer and electrically connecting the second circuit layer with the fourth circuit layer, respectively.

5. The embedded packaging method capable of realizing heat dissipation of claim 4, wherein the step S6 specifically comprises:
   S6.1: attaching a second photosensitive film to each of the first circuit layer and the second circuit layer;
   S6.2: forming, by photolithography and development, a certain number of copper pillar through holes in the second photosensitive film on the first circuit layer and the second circuit layer, respectively;
   S6.3: removing the second photosensitive film after forming the certain number of second copper pillars in the copper pillar through holes by electroplating; and
   S6.4: filling and press-fitting a dielectric material to form a first sealing layer and a second sealing layer on the first circuit layer and the second circuit layer, respectively, and thinning the dielectric material by etching to expose the second copper pillars.

6. The embedded packaging method capable of realizing heat dissipation of claim 1, further comprising:
   S8: coating or press-fitting a solder resist on an outermost circuit layer, and forming a solder resist window on the solder resist.

7. The embedded packaging method capable of realizing heat dissipation of claim 1, wherein the frame is made of resin.

* * * * *